US005770101A

United States Patent [19]
Fujii et al.

[11] Patent Number: 5,770,101
[45] Date of Patent: Jun. 23, 1998

[54] MAGNETOSTATIC-WAVE DEVICE

[75] Inventors: Takashi Fujii, Otokuni-gun; Hiroshi Takagi, Ohtsu, both of Japan

[73] Assignee: Murata Manufacturing Co., Ltd., Japan

[21] Appl. No.: 539,597

[22] Filed: Oct. 5, 1995

Related U.S. Application Data

[63] Continuation-in-part of Ser. No. 179,932, Jan. 11, 1994, abandoned.

[30] Foreign Application Priority Data

Jan. 11, 1993 [JP] Japan ..................................... 5-019538

[51] Int. Cl.$^6$ ............................. H03H 2/00; H01F 10/04; H01F 10/28
[52] U.S. Cl. ....................... 252/62.57; 423/263; 117/945; 333/202; 333/219.2
[58] Field of Search ................................ 333/219.2, 202; 252/62.57; 117/945; 423/263

[56] References Cited

FOREIGN PATENT DOCUMENTS 522388  1/1993  European Pat. Off. .

OTHER PUBLICATIONS

Chemical Abstracts citation 77:81285: "Preparation and magnetic properties of two new oxyflluoride ferrites with the garnet structure, $Y_3Fe_5O_{12-x}F_x(O\leq x\leq 1)$ and $Y_3Fe_{5-x}Zn_xO_{12-x}F_x(O\leq x\leq 0.7)$", Tanguy et al, Mater. Res. Bull. (1971), 6(1), 63–8.

Chemical Abstract cit. 79:152471: "New Yttrium or Gadolinium Oxyflouride Ferrites with a Garnet Structure", Morell et al, J. Solid State Chem., 8(3), pp. 253–259, 1973.

Chemical Abstract cit. 73:8803: "New Oxyfluorinated Phase of Granet Types Gd3Fe20(12–x)Fx,(O<x<0.60)", Portier et al, C.R. Acad. Sci., Ser. C 270 (9), pp. 821–824, 1970.

*Primary Examiner*—Melissa Bonner
*Attorney, Agent, or Firm*—Ostrolenk, Faber, Gerb & Soffen, LLP

[57] ABSTRACT

A magnetostatic wave device comprises a magnetic single-crystal garnet and at least one element of the halogen group incorporated therein. A magnetostatic wave device comprises a thin magnetic garnet single-crystal film. The film consists essentially of yttrium-iron-garnet including at least one halogen element incorporated therein.

6 Claims, 3 Drawing Sheets

MAGNETOSTATIC-WAVE DEVICE

This is a continuation-in-part application of application of Ser. No. 08/179,932, filed Jan. 11, 1994 now abandoned.

BACKGROUND OF THE INVENTION

1. Field of the Invention

The present invention relates to a material for magnetostatic-wave devices and, more particularly, to a magnetostatic-wave device comprising a magnetic garnet single-crystalline film.

2. Description of the Prior Art

As a material for single-crystal magnetic garnet used in magnetostatic wave devices, there has been used an yttrium-iron-garnet ($Y_3Fe_5O_{12}$, hereinafter referred to as "YIG") which is of particular importance. In particular, YIG has an extremely small ferromagnetic resonance absorption half-line width ($\Delta H$), thus making it possible to reduce a difference between input and output signals of magnetostatic wave (MSW) elements or devices.

Single-crystal YIG films are generally produced by liquid-phase epitaxy (LPE) in which raw materials for the garnet film, ferric oxide ($Fe_2O_3$) and yttrium oxide ($Y_2O_3$), are dissolved in a molten oxide solution composed of lead oxide (PbO) and boric oxide ($B_2O_3$), and a single-crystal substrate of non-magnetic gadolinium-gallium-garnet ($Gd_3Ga_5O_{12}$, hereinafter referred to as "GGG") is immersed into the solution for deposition of a single-crystal thin film.

However, it is often impossible to obtain the desired magnetic properties or to reproduce the magnetic properties even if the single-crystal YIG thin films were grown under the same deposition conditions and subjected to the same thermal histories after film growth. Thus, the magnetic properties are variable in the single-crystal YIG thin film, causing a lowering of magnetic characteristics of magnetostatic wave devices employing such a single-crystal YIG thin film.

SUMMARY OF THE INVENTION

It is therefore an object of the present invention to provide a magnetostatic-wave device with improved magnetic characteristics.

According to the present invention, there is provided a magnetostatic wave device comprising a thin magnetic garnet single-crystal film, said single crystalline film consisting essentially of yttrium-iron-garnet including at least one halogen element incorporated therein.

The above halogen includes all the elements of group VIIB of the periodic table and are selected from the group consisting of fluorine, chlorine, bromine, iodine and astatine. The content of the halogen element in $Y_3Fe_5O_{12}$ is 0.5% by weight or below, preferably, in the range of 0.001 to 0.1 wt %. The halogen (X) may be incorporated in the form of a halide such as $FeX_3$ (e.g., $FeF_3$, $FeCl_3$, $FeBr_3$, etc.) and $YX_3$ (e.g., $YF_3$, $YCl_3$, etc.)

Thus, according to the present invention, there is provided a magnetostatic wave device comprising a thin magnetic garnet single-crystalline film, said single crystalline film consisting essentially of yttrium-iron-garnet with at least one halogen element incorporated therein, the content of said at least one halogen element being 0.5% by weight or below, preferably, from 0.001 to 0.1 wt %.

In general, iron exhibits two valences and varies easily from divalent ions to trivalent ions or vice versa according to the surroundings. Theoretically, iron in the magnetic garnet film, e.g., YIG, should be present in the trivalent state since yttrium and oxygen are present in the positive trivalent state and negative divalent state, respectively. However, if iron has varied from the trivalent state to the divalent state according to the deposition conditions or thermal histories thereafter, the results would be non-uniformity of the magnetic properties of the single-crystal YIG. In this case, if a part of iron, x, in YIG has varied from the trivalent state to the divalent state, the electrical equilibrium conditions is given by formula (1):

as the sum of positive charges and negative charges should be 0. From the standpoint of the neutralization of electrical charges, the composition is short of oxygen atoms entering the oxygen lattice by x/2. In order to make up for deficiency, point defects with no charges, so-called Schottky defects, are produced in the crystal by x/2, as expressed by $\square^0$ in Formula (1). The single-crystal YIG thin films containing $Fe^{2+}$ are chemically stabilized by the presence of such point defects in the crystal structure. However, the presence of point defects causes generation of local nuclear spins, resulting in considerable lowering of the magnetostatic wave characteristics of the YIG film.

If a certain amount of at least one halogen element is incorporated into YIG in accordance with the present invention, the point defects expressed by $\square^0$ in Formula (1) are replaced with univalent halogen atoms. If the added amount of halogen atoms is greater than the amount required for complement of shortage of oxygen atoms in $Y_3Fe_5O_{12}$, trivalent iron atoms are changed to the divalent state in proportion to an excess amount of halogen atoms to balance electrical charges. Thus, the electrical equilibrium condition of the resultant composition is given by the formula (2):

where X is at least one halogen element, x/2 is shortage of oxygen atoms caused by formation of divalent iron atoms when no halogen is present, y is a molar fraction of halogen elements corresponding to an added amount of the halogen element. Since the content of halogen should be equal to or greater than the shortage of oxygen atoms, i.e, x/2, and since the amount of halogen added to YIG is 0.5% by weight or below, preferably, from 0.001 to 0.1 wt %, y is 0.2 or below and, preferably, ranges from 0.0004 to 0.04. Thus, no point defect is produced in the single-crystal and the neutralization of electronic charges is met by the presence of at least one halogen element. Further, no partial nuclear spin takes place since the halogen atom, $X^{-1}$, takes the electron configuration equivalent to that of atoms of rare gas. Accordingly, it is possible to obtain stable single-crystal magnetic garnet films with excellent magnetic properties.

The above explanation can be applied to other magnetic single-crystal garnets having a basic composition expressed by the general formula:

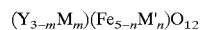

where M is at least one trivalent element, M' is at least one element of trivalent or divalent metals, $0<m<3$, and $0<n<0.5$. In this basic composition, the electrical equilibrium is given by the following formula:

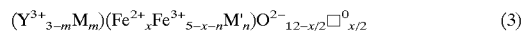

where M is at least one trivalent element, M' is at least one element of trivalent or divalent metals, x is an molar fraction of divalent iron ions, $\square^0$ is point defects, $0<m<3$, and $0<n<0.5$.

If a certain amount of at least one halogen element is incorporated into the above basic composition, electrical equilibrium is established as follows:

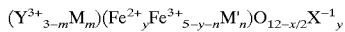

where M is at least one trivalent element, M' is at least one element of trivalent or divalent metals, X is at least one halogen element, 0<m<3, 0<n<0.5, x/2 is shortage of oxygen atoms caused by formation of divalent iron atoms when no halogen is present, and y is a molar fraction of halogen elements corresponding to an added amount of the halogen element. The y is 0.2 or below and, preferably, ranges from 0.0004 to 0.04 since the amount of at least one halogen element added to $(Y^{3+}_{3-m}M_m)$ $(Fe^{2+}_xFe^{3+}_{5-n}M'_n)O_{12}$ is 0.5% by weight or below, preferably, 0.001 to 0.1 wt %.

As the trivalent element M, there may be used those such as Bi, Sb, and lanthanoide (La, Ce, Pr, Nd, Pm, Sm, Eu, Gd, Tb, Dy, Ho, Er, Tm, Yb, Lu). Typical metals used as M' are Ga, In, Tl, Co and Ni. These elements may be used alone or in combination.

The above and other objects, features and advantages of the present invention will be apparent from the following explanation with reference to several examples thereof.

EXAMPLE

Using the LPE process, there were prepared single-crystal magnetic garnet films in the following manner: Powders of $Fe_2O_3$, $FeF_3$, $Y_2O_3$ were weighed, mixed and then added to a solvent composed of PbO and $B_2O_3$ to prepare a mixture consisting essentially of 9.0 mol % of $Fe_2O_3$, 0.5 mol % of $FeF_3$, 0.5 mol % of $Y_2O_3$, 84.6 mol % of PbO and 5.4 mol % of $B_2O_3$. The resultant mixture was placed in a platinum crucible and heated to 1200° C. by an LPE furnace to prepare a homogeneous melt. The melt was then cooled to and kept at 900° C. at which crystal growth of YIG takes place. Then, a single-crystal GGG substrate was immersed into the melt to deposit a single-crystal YIG thin film on the substrate by the LPE process. After formation of the single-crystal YIG thin film, the substrate was drawn up from the melt and rotated at a high rate of revolution to remove the melt from the single-crystal YIG thin film. Analysis of the resultant single-crystal YIG thin film showed that the content of F in the thus produced film is 0.02 wt %.

For samples of the resultant single-crystal YIG thin film, a ferromagnetic resonance spectrum was observed by an electron spin resonance (ESR) spectroscopy. The result is shown in FIG. 1.

Figure 1:
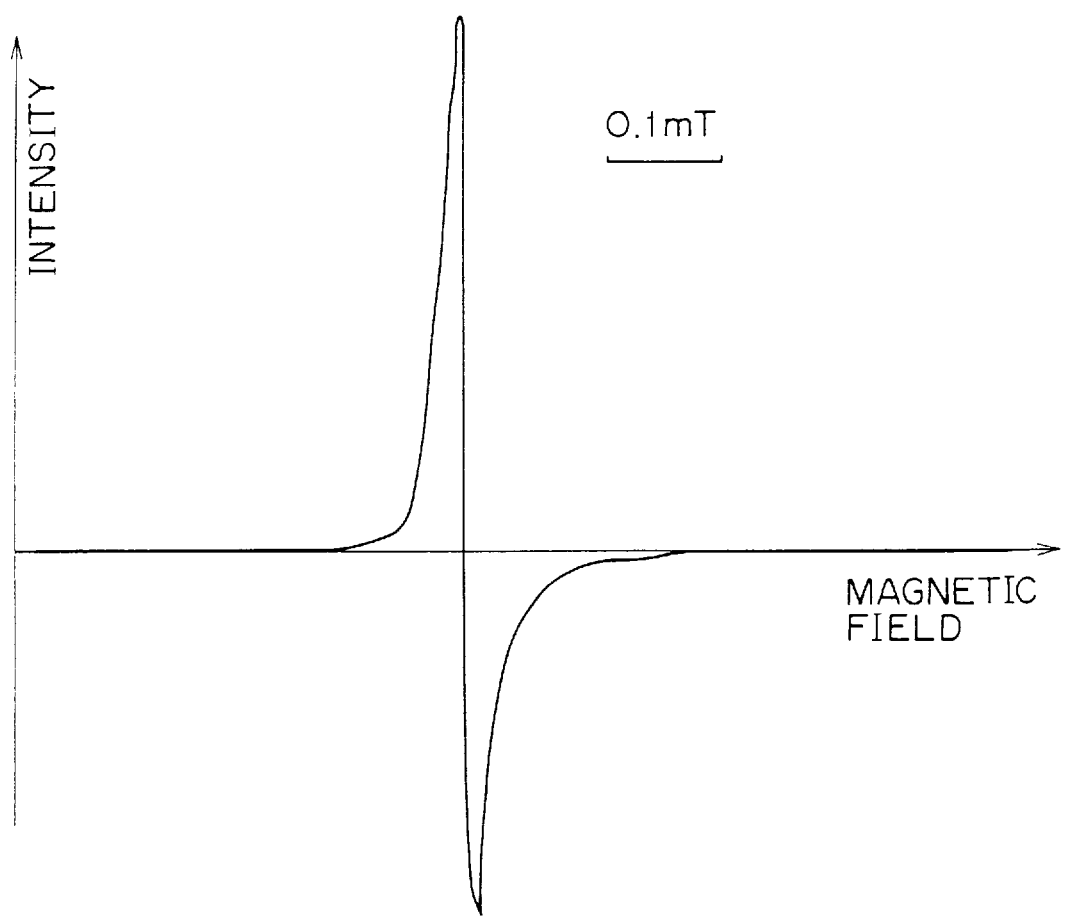
FIG. 1 is a graph showing ferromagnetic resonance spectrum (Lorentz type) for a single-crystal YIG thin film according to the present invention.

From FIG. 1, it can be seen that the ferromagnetic resonance spectrum for the single-crystal YIG film of the present invention contains only one peak.

Further, the single-crystal YIG thin film was subjected to heat-treatment in oxygen gas at 900° C. for 6 hours, but no change was observed in the ferromagnetic resonance spectrum.

COMPARATIVE EXAMPLE

Using the same raw materials except $FeF_3$, there were prepared single-crystal YIG thin films containing no halogen atoms in the same manner as in the Example. For a sample of the single-crystal YIG thin film thus produced, a ferromagnetic resonance spectrum was observed by the electron spin resonance spectroscopy. The result is shown in FIG. 2.

Figure 2:
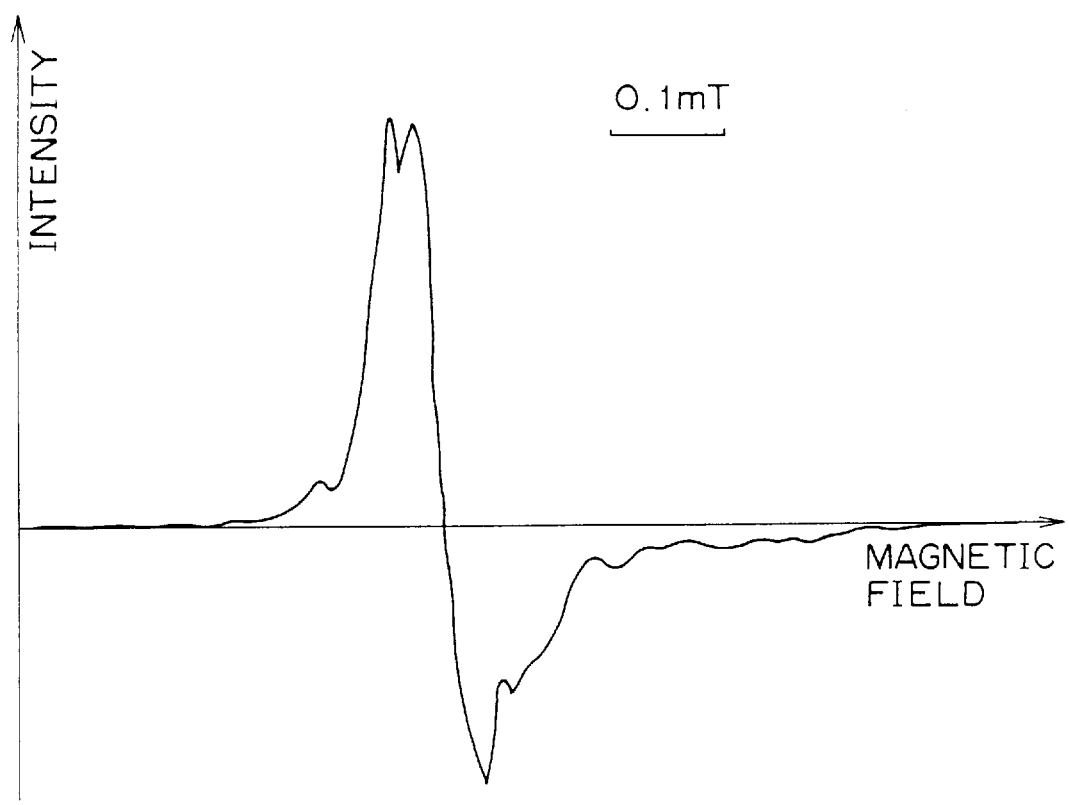
FIG. 2 is a graph showing a ferromagnetic resonance spectrum for a single-crystal YIG thin film of the prior art.

From the result show in FIG. 2, it can be seen that the ferromagnetic resonance spectrum for the single-crystal YIG film of the prior art contains two peaks. Also, the heat-treatment of the single-crystal YIG film of the prior art showed that the ferromagnetic resonance spectrum varies with the thermal conditions applied to the film.

Figure 3:
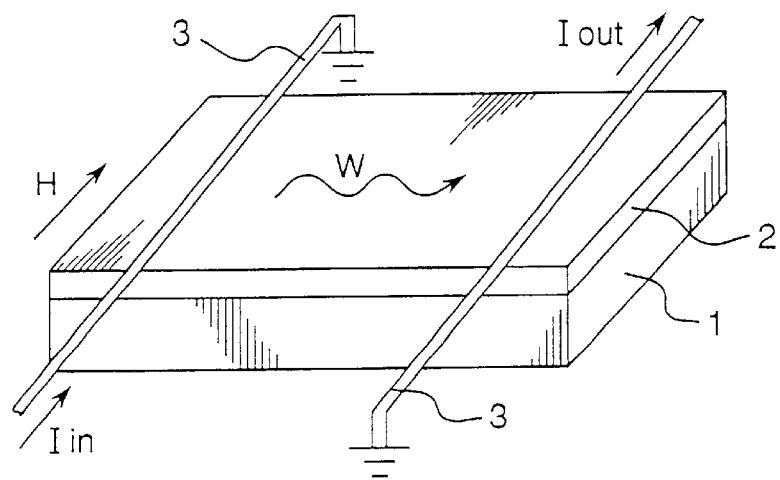
FIG. 3 is a perspective view of a magnetostatic wave device used for determination of filter characteristics.

Using 0.02 wt % F-containing single-crystal YIG films prepared in the above example and those prepared in the comparative example, magnetostatic wave devices were prepared by forming electrodes 3 on the single crystal film 2 on the GGG substrate 1 as shown in FIG. 3 to determine filter characteristics. In FIG. 3, H is a direction of applied external magnetic filed applied to the device during measurement of filter characteristics, $I_{in}$ is a direction of an input of microwaves, W is a direction of propagation of magnetostatic surface waves, and $I_{out}$ is a direction of an output of microwaves. The results are shown in FIG. 4.

Figure 4:
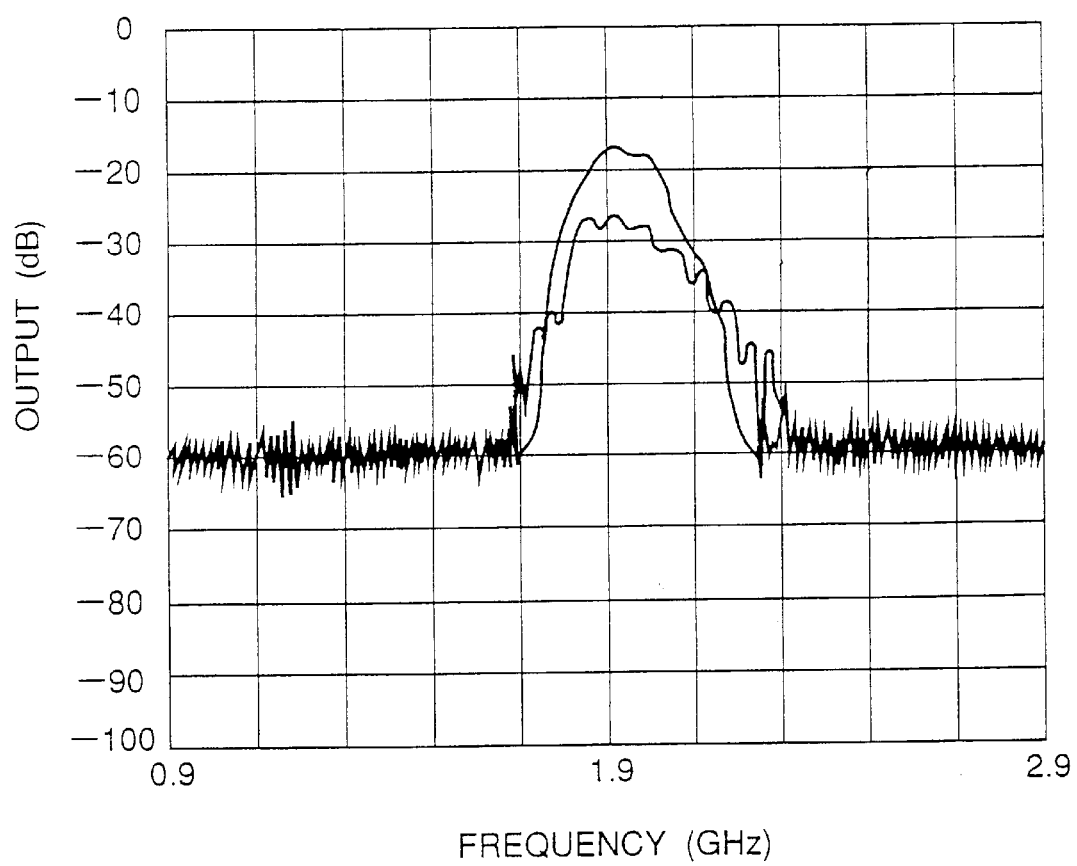
FIG. 4 is a graph showing filter characteristics of magnetostatic wave devices employing a single-crystal YIG thin film of the present invention and that of the prior art.

As can be seen from the results shown in FIG. 4, the magnetostatic wave device according to the present invention is much improved in filter characteristics as compared with that of the comparative example.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

We claim:

1. A magnetostatic wave device comprising a thin magnetic garnet single-crystal film consisting essentially of yttrium-iron-garnet containing at least one halogen therein in which the molar amount of halogen ranges from 0.0004 to 0.04, wherein the composition of said yttrium-iron-garnet is expressed by the formula $(Y^{3+}_{3m}M_m)$ $(Fe^{2+}_yFe^{3+}_{5-y-n}M'_n)$ $O^{2-}_{12-x/2}X^{1-}_y$ in which X is at least one halogen, M is at least one trivalent element, and M' is at least one divalent or tetravalent metal, m is greater than 0 to less than 3, n is greater than 0 to less than 0.5, x is the molar fraction of divalent iron and y is the molar fraction of halogen.

2. The magnetostatic wave device according to claim 1, wherein M is selected from the group consisting of Bi, Sb, La, Ce, Pr, Nd, Pm, Sm, Eu, Gd, Tb, Dy, Ho, Er, Tm, Yb and Lu.

3. The magnetostatic wave device according to claim 2, wherein M' is selected from the group consisting of Ga, In, Tl, Co and Ni.

4. The magnetostatic wave device according to claim 1, wherein M' is selected from the group consisting of Ga, In, Tl, Co and Ni.

5. The magnetostatic wave device according to claim 4, wherein the content of said at least one halogen element ranges from 0.001 to 0.1 wt %.

6. The magnetostatic wave device according to claim 4, wherein said at least one halogen element is F.

* * * * *